United States Patent
Wang et al.

(10) Patent No.: US 8,216,933 B2
(45) Date of Patent: *Jul. 10, 2012

(54) KRYPTON SPUTTERING OF LOW RESISTIVITY TUNGSTEN

(75) Inventors: Wei D. Wang, San Jose, CA (US); Srinivas Gandikota, Santa Clara, CA (US); Kishore Lavu, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 74 days.

This patent is subject to a terminal disclaimer.

(21) Appl. No.: 12/872,522

(22) Filed: Aug. 31, 2010

(65) Prior Publication Data

US 2010/0330795 A1   Dec. 30, 2010

Related U.S. Application Data

(63) Continuation of application No. 11/841,205, filed on Aug. 20, 2007, now Pat. No. 7,790,604.

(51) Int. Cl.
   *H01L 21/02*   (2006.01)
(52) U.S. Cl. ........ 438/628; 438/635; 438/684; 438/721; 438/722; 257/E21.169; 257/E21.526; 257/E21.565; 257/E21.598; 257/E23.161
(58) Field of Classification Search .......... 438/626–722; 257/E21.169, 576–598, 23.145, 161
   See application file for complete search history.

(56) References Cited

U.S. PATENT DOCUMENTS

| | | | |
|---|---|---|---|
| 4,336,118 A | 6/1982 | Patten et al. | |
| 4,786,468 A | 11/1988 | Wang et al. | |
| 5,202,008 A | 4/1993 | Talieh et al. | |
| 5,633,199 A | 5/1997 | Fiordalice et al. | |
| 6,077,779 A * | 6/2000 | Shue et al. | 438/680 |
| 6,200,433 B1 | 3/2001 | Ding et al. | |
| 6,709,553 B2 * | 3/2004 | Wang et al. | 204/192.3 |
| 7,790,604 B2 * | 9/2010 | Wang et al. | 438/626 |
| 2003/0183243 A1 * | 10/2003 | Collins et al. | 134/1 |
| 2004/0108599 A1 | 6/2004 | Takayama et al. | |
| 2004/0214417 A1 | 10/2004 | Rich et al. | |
| 2007/0095651 A1 | 5/2007 | Ye et al. | |
| 2009/0047760 A1 | 2/2009 | Yamazaki et al. | |
| 2009/0220777 A1 | 9/2009 | Sporn | |

OTHER PUBLICATIONS

International Search Report—Oct. 17, 2008.

* cited by examiner

*Primary Examiner* — Michael Lebentritt
(74) *Attorney, Agent, or Firm* — Charles S. Guenzer

(57) ABSTRACT

A method of depositing a bilayer of tungsten over tungsten nitride by a plasma sputtering process in which krypton is used as the sputter working gas during the tungsten deposition. Argon may be used as the sputtering working gas during the reactive sputtering deposition of tungsten nitride. The beneficial effect of reduction of tungsten resistivity is increased when the thickness of the tungsten layer is less than 50 nm and further increased when less than 35 nm. The method may be used in forming a gate stack including a polysilicon layer over a gate oxide layer over a silicon gate region of a MOS transistor in which the tungsten nitride acts as a barrier. A plasma sputter chamber in which the invention may be practiced includes gas sources of krypton, argon, and nitrogen.

18 Claims, 3 Drawing Sheets

KRYPTON SPUTTERING OF LOW RESISTIVITY TUNGSTEN

RELATED APPLICATION

This application is a continuation of Ser. No. 11/841,205, filed Aug. 20, 2007, and issued as U.S. Pat. No. 7,790,604 on Sep. 7, 2010.

FIELD OF THE INVENTION

The invention relates generally to sputter deposition in the formation of semiconductor integrated circuits. In particular, the invention relates to sputter deposition of heavy metals.

BACKGROUND ART

The continuing miniaturization of semiconductor integrated circuits has forced many conventional structures to change and has required the accompanying need to improve the processes used to create the new structures. A conventional MOS (metal oxide semiconductor) transistor gate structure for larger feature sizes, illustrated in the cross-sectional view of FIG. 1, includes highly doped source/drain (S/D) regions 10, 12 formed into a lesser doped silicon layer 14, which may be formed epitaxially over a silicon wafer or even in an silicon-on-insulator (SOI) structure. A thin gate oxide layer 16 may be formed over the entire MOS area, possibly before the implantation and anneal steps for the S/D regions 10, 12. Gate stacks 18 are formed over the gate oxide layer 16. Conventionally, the gate stacks 18 are formed by sequentially depositing a polysilicon layer 20, a tungsten silicide ($WSi_x$) layer 22, and a silicon nitride (SiN) cap layer 24. In a flash memory, an oxide-nitride-oxide (ONO) structure may be sandwiched within the polysilicon layer 20. S/D holes 26 are then photolithographically etched down to the gate oxide layer 16 over the S/D regions 10, 12 to define the stacks 18. Spacers 28, typically of silicon oxide are then formed on the sides of the stacks 18. The S/D regions 10, 12 may be implanted following the formation of the stacks 18 to use the stacks 18 as implant masks. Subsequent processing steps open the gate oxide layer 16 at the bottom of the S/D holes 26, provide an ohmic contact layer if necessary, and fill the S/D holes 26 with polysilicon or a metal to electrically contact the S/D regions 10, 12. The cap layer 24 is removed to provide electrical contact to the top of the gate oxide layer 16 between the S/D regions 10, 12 forming the MOS gate.

This structure was successfully used at the 110 nm node defined by the gate length. However, extending this design to the 90 nm mode has proven difficult. There exists a requirement for a maximum value of the sheet resistance $R_s$ of the unpatterned metal layers of the gate stacks 18, that is, the $WSi_x$ layer 22 in the structure of FIG. 1. As shown by a dotted plot 30 in the graph of FIG. 2, the maximum sheet resistance $R_s$ at 90 nm is about 6 ohms per square. The sheet resistance of a layer decreases with its thickness. The $WSi_x$ layer 22 for a gate length of 90 nm has a sheet resistance varying with the aspect ratio (A/R) of the patterned $WSi_x$ layer 22 shown by plot 32. The aspect ratio is the ratio of the height to the width of the patterned $WSi_x$ layer 22, for which the width is close to the gate length defining the node size. The graph demonstrates that an aspect ratio of at least 10 is required, which translates to a height H of the $WSi_x$ layer 22 of at least 1000 nm at the 90 nm node. Such a structure is not easily manufactured.

As a result, an alternative gate structure illustrated in the cross-sectional view of FIG. 3 has been developed. Its gate stacks 40 include a tungsten nitride (WN) barrier layer 42 and a tungsten (W) via layer 44. The barrier layer 40 is required to prevent the tungsten via layer 44 from siliciding with the polysilicon layer 20. Tungsten metal is much more conductive than tungsten silicide. As a result, as illustrated by plot 46 in FIG. 2, the sheet resistance of the W/WN is much less than a corresponding thickness of $WSi_x$ so that the aspect ratio, at least at 90 nm, need be no more than 1, that is, a height H of about 105 nm. Another example at the 100 nm node includes 32.5 nm of W above 7.5 nm of WN.

Sputtering is the preferred method of depositing the WN barrier layer 42 and the W via layer 44 because of the relatively inexpensive equipment and consumable target, the fast processing available, the capability to sputter both tungsten and tungsten nitride in the same sputter chamber using a tungsten target and the selective supply of nitrogen gas in depositing the nitride layer. Also, sputtered tungsten tends to demonstrate a lower resistivity and smoother surface than tungsten deposited by chemical vapor deposition (CVD).

An example of a sputter chamber 50 useful for sputtering tungsten and tungsten nitride is schematically illustrated in the cross-sectional view of FIG. 4. Such a chamber is available from Applied Materials, Inc. of Santa Clara, Calif. as the CleanW sputter chamber. The sputter chamber 50 includes a vacuum chamber 52 arranged about a central axis 54 on which a tungsten target 56 is supported through an isolator 58, which vacuum seals the target 56 to the vacuum chamber 52 and electrically isolates the target 56 from the electrically grounded vacuum chamber 52. An unillustrated vacuum pump system pumps the interior of the vacuum chamber 52 to a pressure in the low milliTorr range. At least the front surface of the tungsten target 56 is planar. The tungsten target 56 includes a layer of tungsten facing the interior of the vacuum chamber 52 and which typically contains no more than 5 at % of elements other than tungsten to provide a source of sputtered tungsten.

A DC power source 60 negatively biases the target to about 600 to 1000 VDC with respect to the grounded vacuum chamber 52 or unillustrated grounded sidewall shield to excite a sputter working gas into a plasma. Conventionally, argon is the sputter working gas and is supplied into the vacuum chamber 52 from an argon gas source 62 through a mass flow controller 64. The target power excites the sputtering working gas into a plasma and positively charged ions of the plasma are accelerated towards the target 54 and sputter tungsten atoms from it. The density of the plasma is increased by placing in back of the target 56 a magnetron 66 having an inner magnetic pole 68 of one magnetic polarity surrounded by an outer magnetic pole 70 of the opposed magnetic polarity. The poles 68, 70 project a magnetic field into the vacuum chamber 52 parallel to the face of the target 56 to trap electrons and hence increase the plasma density and the resultant sputtering rate. To improve the sputtering uniformity and target utilization, the magnetic poles 68, 70 are asymmetric about the central axis 54 but supported on an arm 72 connected to a shaft 74 extending along the central axis 54. A motor 76 rotates the shaft 74 and hence the magnetron 66 about the central axis 54 to provide at least azimuthal uniformity. A pedestal 80 within the vacuum chamber 52 supports a wafer 82 or other substrate in opposition to the target 56 to be coated with the tungsten sputtered from the target 56. A wafer is generally planar and circular except for alignment indicia. Optionally, an RF power source 84 biases the pedestal 80 through a capacitive coupling circuit 86. The pedestal 80 is conductive so that it acts as an electrode. The RF bias in the presence of a plasma within the vacuum chamber 52 causes a negative DC self-bias to develop on the pedestal 80 so that sputtered tungsten ions are accelerated towards the wafer 82 and their trajectories enter deep within any high aspect-ratio holes formed in the wafer 82.

The same sputter chamber 50 may be used to sputter deposit tungsten nitride (WN) in a reactive sputtering process. Nitrogen is selectively admitted into the vacuum chamber 52 from a nitrogen gas source 90 through a mass flow controller 92. The nitrogen reacts with the sputtered tungsten to form a layer of tungsten nitride on the surface of the wafer 82.

However, as the gate lengths further decrease towards the 35nm node, the resistivity of the sputtered tungsten continues to be a problem.

SUMMARY OF THE INVENTION

One aspect of the invention includes a conductive barrier layer overlying a silicon layer including a tungsten nitride barrier layer overlain by a tungsten layer in which the tungsten layer is deposited by plasma sputtering using krypton as the sputter working gas. The invention is particularly useful when the thickness of the tungsten layer is less than 50 nm, and even more useful when less than 35 nm. The tungsten nitride barrier layer may be reactively sputtered in the same sputter chamber using argon as the sputter working gas.

Another aspect of the invention includes a method of forming a gate stack structure for MOS transistors in which a polysilicon layer overlies a gate oxide layer overlying a silicon gate region. The gate structure further includes a tungsten-based structure including a tungsten via layer and a tungsten nitride barrier layer intermediate the tungsten via layer and the polysilicon layer in which the tungsten via layer is deposited by plasma sputtering using krypton as the sputter working gas.

The invention further includes a plasma sputter chamber including a tungsten target and metered sources of argon, krypton, and nitrogen.

DETAILED DESCRIPTION OF THE PREFERRED EMBODIMENTS

We have observed that the resistivity of a sputtered tungsten layer tends to increase for thicknesses below about 50 nm. The increase is believed to arise from electron scattering at the film surface. When the tungsten is sputtered using argon as the sputtering gas, as illustrated in plots 100, 102 in the graph of FIG. 5 for two different flows of argon, at thicknesses less than about 100 nm, the tungsten resistivity increases from more bulk values of 10 microohm-cm to nearly 13 microohm-cm at a thickness of about 12 nm. The resistivity differs somewhat with the amount of argon supplied, but the difference is relatively small.

Figure 4:
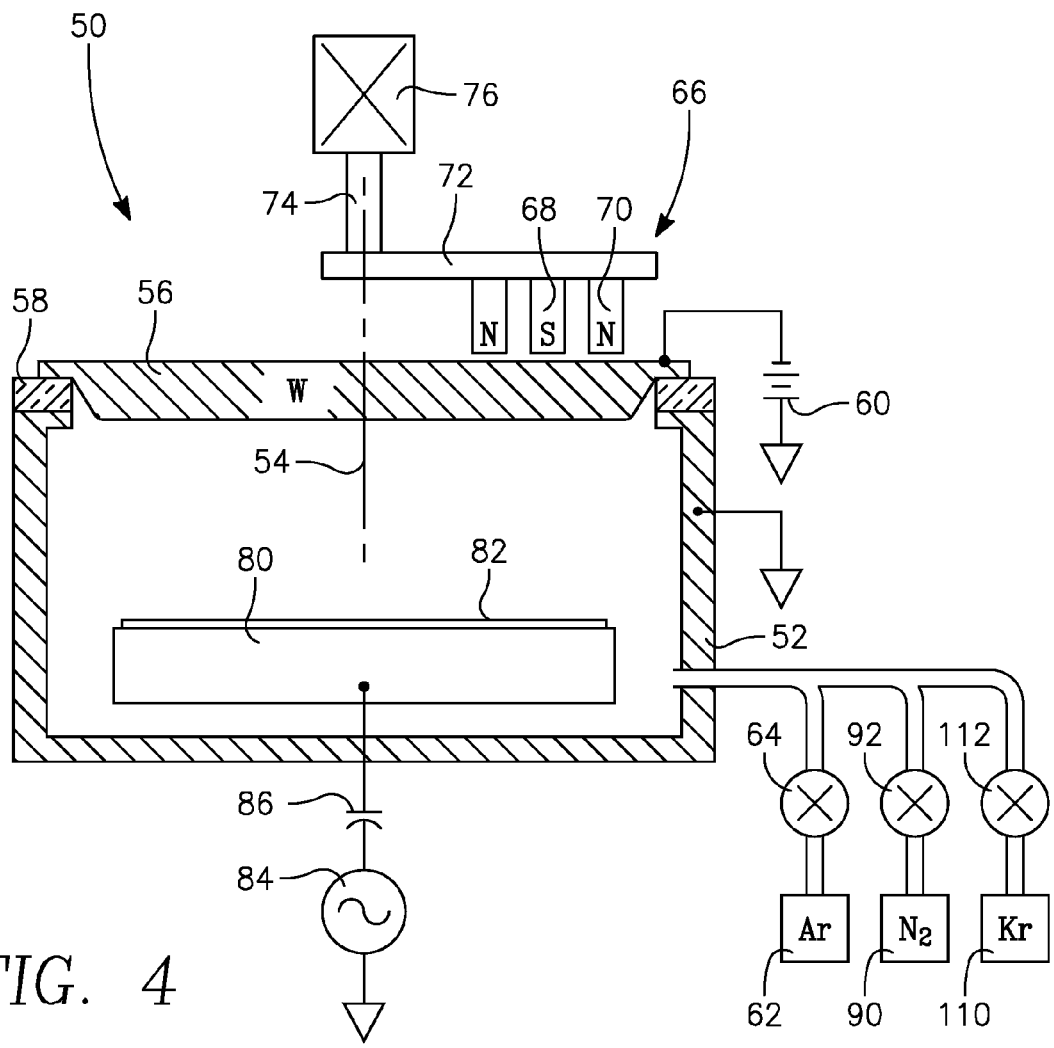
FIG. 4 is a schematic cross-sectional view of a sputter chamber usable for sputtering tungsten according to the invention.

However, according to one aspect of the invention, the sputter working gas is krypton rather than argon. As illustrated in FIG. 4, the krypton is supplied into the vacuum chamber 52 from a krypton gas source 110 through a mass flow controller 112. As shown in plot 114 in FIG. 5, the resistivity of a krypton-deposited tungsten layer is generally less than that of the argon-deposited tungsten layer and the resistivity increases at a much reduced rate as the thicknesses are reduced below 100 nm. In particular, the bulk resistivity value of about 10microohm-cm is maintained but the resistivity at 12 nm increases only to about 11 microohm-cm. A possible explanation for the different resistivity is that krypton ions are much heavier than argon ions and transfer more energy to tungsten atoms in the sputtering process. The more energetic sputtered tungsten atoms are believed to promote larger grain sizes in film growth. In both cases, the tungsten layer was deposited on a 100 nm-thick oxide layer.

For system performance, an important parameter of a tungsten gate stack is the sheet resistance of tungsten sputter deposited on tungsten nitride. A comparative experiment was performed in which varying thicknesses of W were reactively sputtered onto WN using conventional sputter working gas of argon. The measured sheet resistances of a planar layer are shown in plot 116 of the graph of FIG. 5 for the WN/W bilayer sputter deposited using argon as the sputter working gas. As expected, the sheet resistance increases with decreasing thickness. However, the increase from a 100nm thickness to a 25 nm thickness is much greater than the fact or of four resulting from the geometry.

However, if the tungsten layer is sputter deposited using krypton instead of argon as the sputter working gas, the sheet resistance, as shown in plot 118, is less than when argon is the sputter working gas. The reduction of sheet resistance is more pronounced at the smaller thicknesses.

In the experiments from which the krypton sputtering data of plot 108 were derived, argon continued to be used as the sputter working gas in the reactive sputtering of tungsten nitride. It is expected that krypton would work equally effectively in sputter depositing the nitride. However, krypton is much more expensive than the conventional argon and, further, the resistivity of the nitride barrier layer does not seem to be a significant issue. As a result, in this aspect of the invention, the tungsten nitride is deposited by flowing argon and nitrogen into the sputter chamber. The relative flows of argon and nitrogen determine the composition $WN_x$ of the tungsten nitride layer. A typical composition may be $W_{64}N_{35}$ with a small fraction of included Ar. Once the desired nitride thickness is attained, the nitrogen flow is stopped and krypton replaces argon as the sputter working gas. It is appreciated that the krypton and argon flows need not be abruptly and completely switched. For example, during the metal deposition, a lesser amount of argon than of krypton may be flowed into the chamber. It is also possible that some krypton is used in the nitride deposition, but such a procedure would be economically disadvantageous.

For a gate stack, the presently preferred thickness of the tungsten film is between 20 and 50 nm with the effects of the invention being most apparent for thicknesses less than 35 nm. The tungsten sputtering may be performed with a target power of 4 kW, a sputter gas flow of 45 to 90 sccm, and a pedestal heater temperature of 200° C. A deposition time of 20 s produces a tungsten film of about 50 nm thickness.

Figure 1:
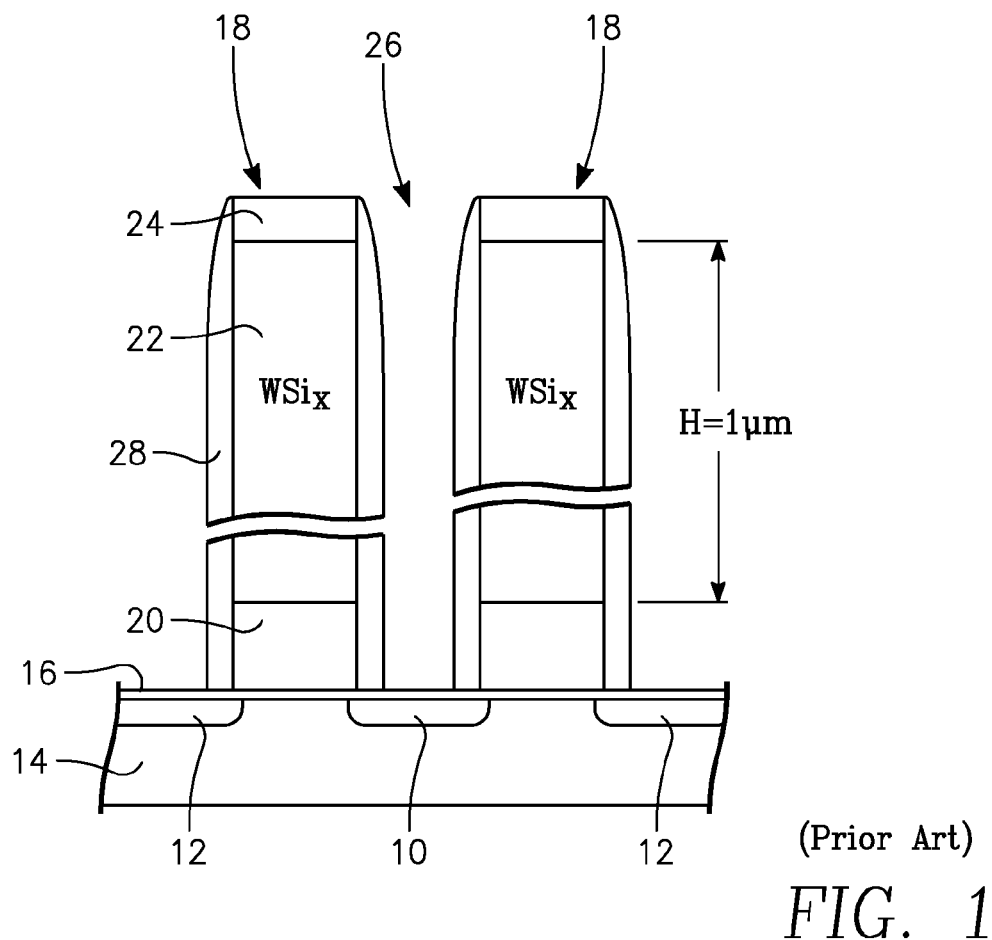
FIG. 1 is a cross-sectional view of a MOS gate stack using a tungsten silicide gate electrode layer.
Figure 2:
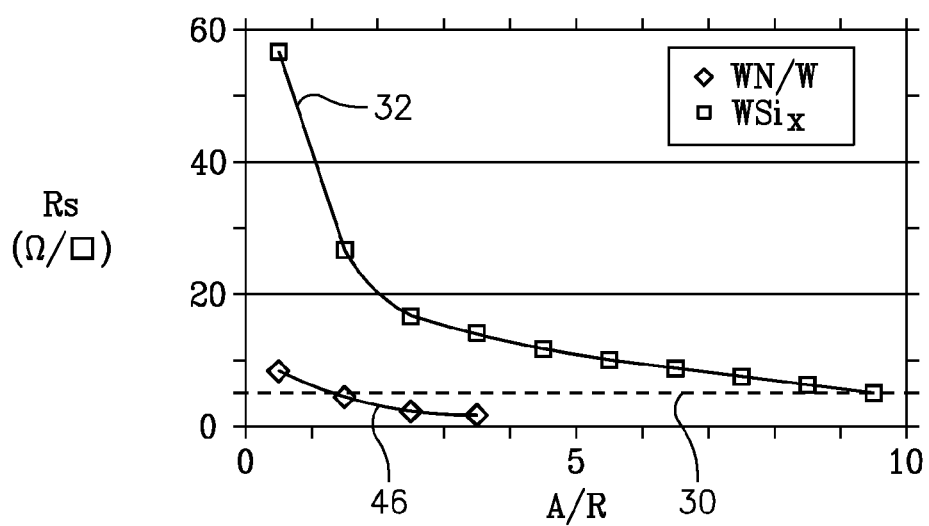
FIG. 2 is a graph illustrating the required aspect ratio of the gate electrode layer for tungsten silicide and tungsten.
Figure 3:
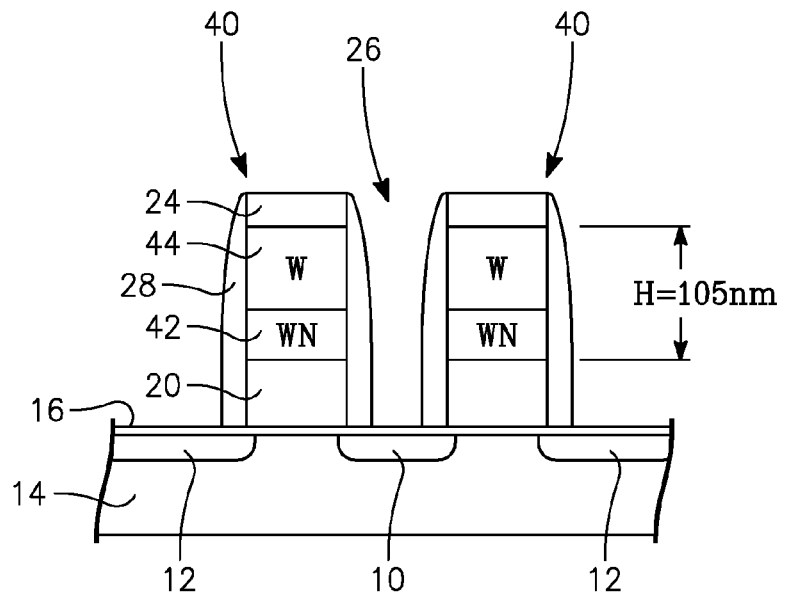
FIG. 3 is a cross-sectional view of a MOS gate stack using a gate electrode layer of tungsten with a tungsten nitride barrier.
Figure 5:
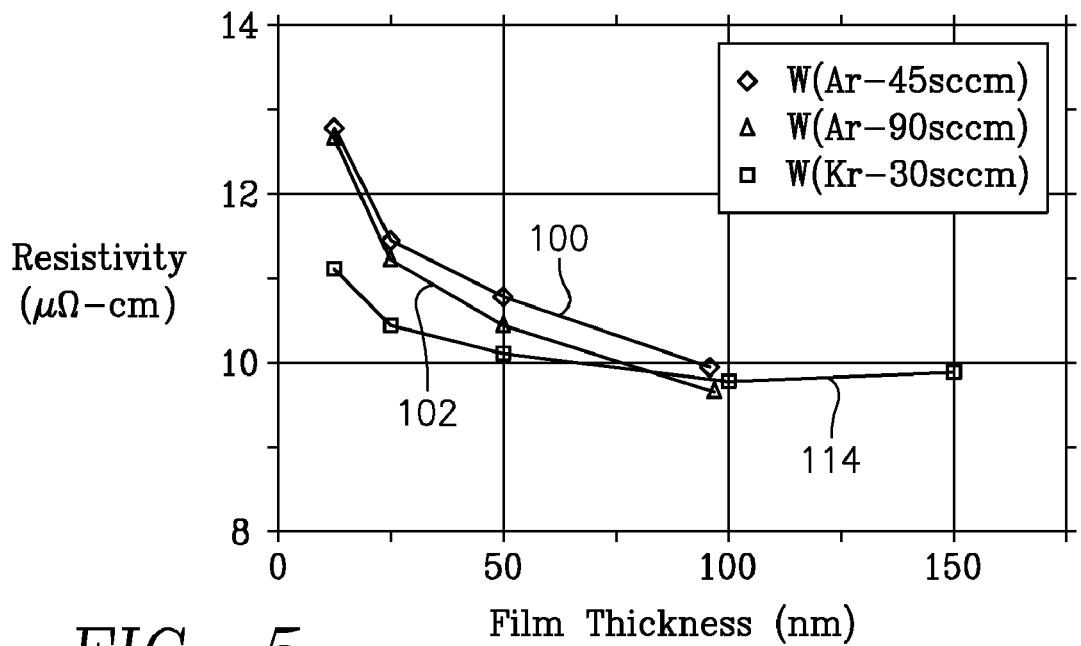
FIG. 5 is a graph illustrating the dependence of electrical resistivity for tungsten sputter deposited using alternatively argon and krypton as the sputter working gas.
Figure 6:
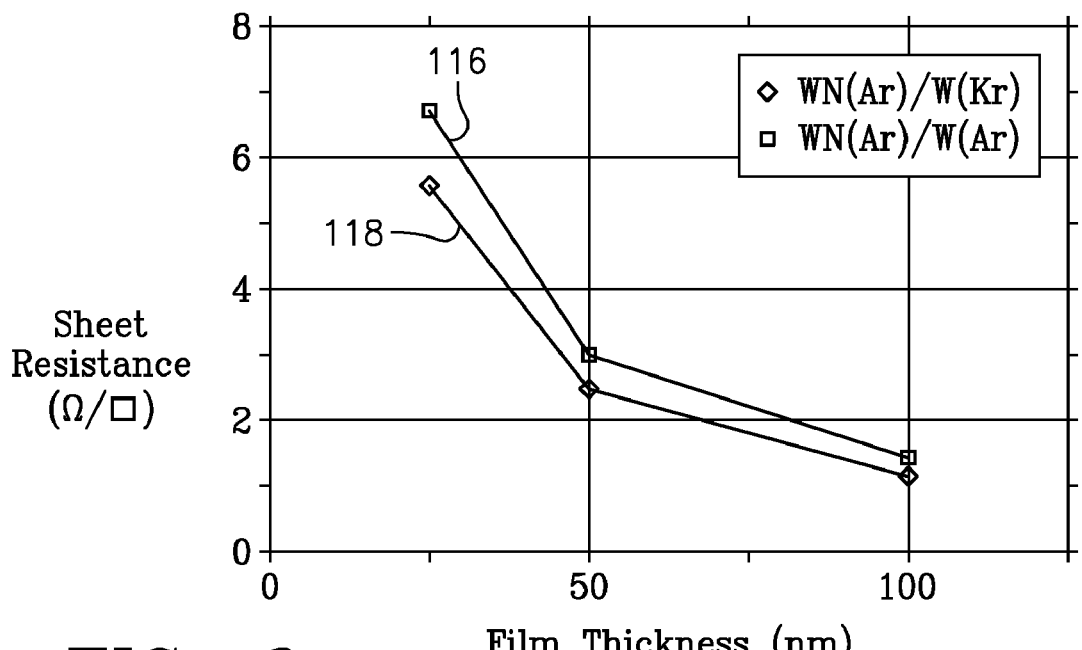
FIG. 6 is a graph illustrating the dependence of electrical sheet resistance for tungsten sputter deposited on tungsten nitride using alternatively argon and krypton as the sputter working gas.

Sputtered tungsten may also be used to form a bit line in the MOS structure of FIG. 2 when implemented in a memory. However, bit lines tend to be much thicker than stack vias, typically around 100 nm and greater The data of FIGS. 5 and 6 show no particular advantage for krypton sputtering at 100 nm. However, at 50 nm and below, krypton sputtering offers clear advantages. At the 35 nm node, gate stack via thicknesses of 35 nm and less are being planned. In this region, krypton sputtering offers clear advantages.

The invention thus provides for increased performance of gate stacks and other integrated circuit structures with only minor modifications of existing processes and processing chambers.

What is claimed is:

1. A method of sputter depositing a tungsten structure in an integrated circuit, comprising the steps of:
   providing a plasma sputter chamber including a target comprising tungsten and a pedestal for supporting a substrate to be sputter deposited in opposition to the target;
   a first step of depositing a barrier layer on the substrate without the use of krypton; and
   a subsequent second step of flowing krypton into the chamber and exciting it into a plasma to deposit a tungsten layer on the barrier layer.

2. The method of claim 1, wherein the tungsten layer has a thickness of less than 100nm.

3. The method of claim 1, wherein the this is less than 50nm.

4. The method of claim 3, wherein the tungsten layer has a thickness of less than 35nm.

5. The method of claim 1, wherein the thickness is greater than 20nm.

6. The method of claim 1, wherein a resistivity of the tungsten layer would be higher if only argon were used in the second step as the sputter working gas.

7. The method of claim 1, wherein the first step includes flowing argon and no effective amount of sputter gas other than argon into the chamber and exciting it into a plasma while also flowing nitrogen into the chamber to deposit the barrier layer comprising tungsten nitride.

8. A method of sputter depositing a tungsten structure to form a gate stack in a MOS structure, comprising the steps of:
   disposing within a plasma sputter chamber having a target comprising tungsten a substrate containing a polysilicon layer on its surface overlying a gate oxide layer overlying a silicon layer;
   a first step of depositing a barrier layer over the polysilicon layer without the use of krypton; and
   a second step of admitting krypton into the chamber to deposit a tungsten layer over the barrier layer.

9. The method of claim 8, wherein the tungsten layer has a thickness of no more than 100nm.

10. The method of claim 9, wherein the thickness is no more than 35nm.

11. The method of claim 10, wherein the thickness is more than 20nm.

12. The method of claim 8, wherein more argon is admitted into the chamber in the first step than in the second step.

13. The method of claim 8, wherein the first step includes flowing into the chamber nitrogen and a sputter working gas consisting of argon and no effective amount of sputter gas other than argon and exciting the sputter working gas to thereby deposit the barrier layer comprising tungsten nitride.

14. A method of forming an integrated circuit structure including sputter depositing a tungsten structure onto a substrate practiced in a plasma sputter chamber including a target comprising tungsten and a pedestal for supporting the substrate in opposition to the target, comprising the steps of:
   a first step of flowing a first gas consisting of argon and nitrogen into the chamber and exciting it into a first plasma to deposit a tungsten nitride layer on the substrate; and
   a second step of flowing a second gas comprising krypton into the chamber and exciting it into a second plasma to deposit a tungsten layer on the tungsten nitride layer.

15. A method of sputter depositing a tungsten structure in an integrated circuit, comprising the steps of:
   providing a plasma sputter chamber including a target comprising tungsten and a pedestal for supporting a substrate to be sputter deposited in opposition to the target;
   a first step of flowing a sputter gas containing no effective amount of a gas other than argon into the chamber and exciting the it into a plasma while also flowing nitrogen into the chamber to deposit a barrier layer comprising tungsten nitride on the substrate; and
   a subsequent second step of flowing krypton into the chamber and exciting it into a plasma to deposit a conductive layer comprising tungsten on the barrier layer.

16. The method of claim 15, wherein the conductive layer has a thickness of no more than 100nm.

17. The method of claim 1, wherein the barrier layer comprises tungsten and nitrogen.

18. The method of claim 8, wherein the barrier layer comprises tungsten and nitrogen.

* * * * *